US006285048B1

(12) United States Patent
Azuma et al.

(10) Patent No.: US 6,285,048 B1
(45) Date of Patent: Sep. 4, 2001

(54) BARIUM STRONTIUM TITANATE INTEGRATED CIRCUIT CAPACITORS AND PROCESS FOR MAKING THE SAME

(75) Inventors: Masamichi Azuma; Michael C. Scott; Carlos A. Paz de Araujo; Joseph D. Cuchiaro, all of Colorado Springs, CO (US)

(73) Assignees: Symetrix Corporation, Colorado Springs, CO (US); Matsushita Electronics Corporation (JP)

( * ) Notice: Subject to any disclaimer, the term of this patent is extended or adjusted under 35 U.S.C. 154(b) by 0 days.

(21) Appl. No.: 08/165,082

(22) Filed: Dec. 10, 1993

Related U.S. Application Data

(63) Continuation-in-part of application No. 08/132,744, filed on Oct. 6, 1993, now Pat. No. 5,514,822, which is a continuation-in-part of application No. 07/993,380, filed on Dec. 18, 1992, now Pat. No. 5,456,945, and a continuation-in-part of application No. 07/981,133, filed on Nov. 24, 1992, now Pat. No. 5,423,285, and a continuation-in-part of application No. 07/965,190, filed on Oct. 23, 1992, now abandoned, said application No. 07/981,133, filed on Nov. 24, 1992, is a continuation-in-part of application No. 07/807,439, filed on Dec. 13, 1991, said application No. 07/965,190, filed on Oct. 23, 1992, now abandoned, is a continuation-in-part of application No. 07/807,439, filed on Dec. 13, 1991, now abandoned.

(51) Int. Cl.$^7$ .................................................. H01L 31/072

(52) U.S. Cl. ............................................ 257/295; 257/310
(58) Field of Search ................................. 365/117, 145, 365/149; 361/320–322, 311–313, 305, 271; 257/295, 310, 915, 924

(56) References Cited

U.S. PATENT DOCUMENTS 3,862,829 * 1/1975 Brandmayr et al. ............. 65/32.3

| 4,347,167 | * | 8/1982 | Payne et al. | 252/520 |
| 5,046,043 | * | 9/1991 | Miller et al. | 257/295 |
| 5,122,923 |   | 6/1992 | Matsubara et al. | 361/321 |
| 5,146,299 | * | 9/1992 | Lampe et al. | 257/295 |
| 5,216,572 | * | 6/1993 | Larson et al. | 257/295 |

OTHER PUBLICATIONS

K. Koyama, et al., "A Stacked Capacitor with $(Ba_xSr_{1-x})TiO_3$ For 256M DRAM" IEDM, Dec. 1991, pp. 823–826.

G.M. Vest, et al., "Synthesis of Metallo–Organic Compounds for MOD Powders and Films" 1986 Materials Research Society, pp. 35–42.

J.V. Mantese, et al., "Metalorganic Deposition (MOD): A Nonvacuum, Spin-on, Liquid–Based, Thin Film Method", MRS Bulletin, Oct. 1989, pp. 48–53.

L.D. McMillan, et al., "Deposition of $Ba_{1-x}Sr_xTio_3$ and $SrTio_3$ via Liquid Source CVD (LSCVD) For ULSI Drams", Presented at 1992 ISIF Conference, Mar. 1992.

B.M. Melnick, et al., "Process Optimization and Characterization of Device Worthy Sol–Gel Based PZT For Ferroelectric Memories", 1990 Gordon and Breach Science Publishers S.A.

(List continued on next page.)

Primary Examiner—Sara Crane
(74) Attorney, Agent, or Firm—Patton Boggs LLP (57) ABSTRACT

Integrated circuit capacitors in which the capacitor dielectric is a thin film of BST having a grain size smaller than 2000 Å. Typical gain sizes are 40 nanometers and less. The BST is formed by deposition of a liquid precursor by a spin-on process. The original liquid precursor includes an alkoxycarboxylate dissolved in 2-methoxyethanol and an xylene exchange is preformed just prior to spinning. The precursor is dried in air at a temperature of about 400° C. and then furnace annealed in oxygen at a temperature of between 675° C. and 850° C.

13 Claims, 8 Drawing Sheets

OTHER PUBLICATIONS

Robert W. Vest, et al., "PbTio$_3$ Films From Metalloorganic Precursors", IEEE Transactions on Ultrasonics, Ferroelectrics, and Frequency Control, vol. 35, No. 6, Nov. 1988, pp. 711–717.

M. Azuma, et al., "Electrical Characteristics of High Dielectric Constant Materials for Integrated Ferroelectrics", 1992 ISIF, Mar. 1992, pp. 109–117.

R. Buchanan (Editor), "Ceramic Materials for Electonics," Marcel Dekker, Inc, NY, 1986, pp. 86–99.*

Buchanan, "Ceramic Materials for Electronics, Processing, Properties, and Applications", Marcel Dekker, Inc., New York, 1986, pp. 86–99.*

* cited by examiner

BARIUM STRONTIUM TITANATE INTEGRATED CIRCUIT CAPACITORS AND PROCESS FOR MAKING THE SAME

This application is a continuation-in-part of U.S. patent application Ser. No. 08/132,744 filed Oct. 6, 1993, now U.S. Pat. No. 5,514,822 which in turn is a continuation-in-part of U.S. patent applications Ser. No. 07/993,380 filed Dec. 18, 1992, now U.S. Pat. No. 5,456,945 Ser. No. 07/981,133 filed Nov. 24, 1992, now U.S. Pat. No. 5,423,285 and Ser. No. 07/965,190 filed Oct. 23, 1992, abandoned; the latter two applications are in turn continuations-in-part of U.S. patent application Ser. No. 07/807,439 filed Dec. 13, 1991, abandoned.

BACKGROUND OF THE INVENTION

1. Field of the Invention

The invention in general relates to the fabrication of integrated circuits, and more particularly to the fabrication of capacitors utilizing barium strontium titanate as the capacitor dielectric.

2. Statement of the Problem

A crucial problem of ULSI (ultra-large-scale integration) DRAMs (dynamic random access memories) is how to provide sufficient storage capacitance in the small memory cell area available. In conventional DRAM's this problem is addressed by providing capacitors with highly complex structures to maximize the area of the capacitor. Such complex capacitors require complex fabrication processes, leading to decreased yields and increased cost. An alternative proposed solution is to use dielectric materials of high dielectric constant. Metal oxide materials, such as barium strontium titanate, commonly referred to as BST, are known to be useful in making integrated circuit thin film capacitors having high dielectric constants. See for example, Kuniaki Koyama, et al., "A Stacked Capacitor With $(Ba_xSr_{1-x})TiO_3$ For 256M DRAM" in IDEM (International Electron Devices Meeting) Technical Digest, December 1991, pp.32.1.1–32.1.4, and U.S. Pat. No. 5,122,923 issued to Shogo Matsubara et al. However both these references use sputtering to deposit the BST, which is inherently hard to control. Such conventional processes, while useful in conventional silicon technology, when used in combination with capacitors that use metal oxides, such as BST, as the dielectric, result in capacitors that have relatively high leakage current, fatigue significantly, and generally have undesirable electrical properties. In particular, while the dielectric constant of bulk BST is of the order of 300 to 4000, the dielectric constant of thin films made according to the conventional processes is significantly lower. This is believed to be due to surface charges caused by defects and impurities in the films.

The process of spin coating has been used for making metal oxides such as barium titanate, strontium titanate, and barium strontium titanate. See G. M. Vest and S.Singaram, "Synthesis" of "Metallo-organic Compounds For MOD Powders and Films", *Materials Research Society Symposium Proceedings*, Vol. 60, 1986, pp. 35–42, Robert W. Vest and Jiejie Xu, "$PbTiO_3$ Thin Films From Metalloorganic Precursors", *IEEE Transactions On Ultrasonics, Ferroelectrics, and Frequency Control*, Vol 35, No. 6, November 1988, pp. 711–717, and "Metalorganic Deposition (MOD): A Nonvacuum, Spin-on, Liquid-Based, Thin Film Method", *Materials Research Society Bulletin*, October 1989, pp. 48–53. In these papers, it was speculated that this process might have limited use for electronic devices, however, the grain size reported was 2000 Å minimum, which is as large or larger than the film thickness typically used for capacitor dielectrics in integrated circuits, and the quality of the film was inferior to that produced by other processes, such as sputtering, and thus the spin-on process as applied to these metal-oxides up to now has been limited to inks for screen printing and other macroscopic purposes. A paper given by some of the present inventors disclosed using a spin-on process to deposit BST, but does not disdose any further details of the process, and the spin-on process used yields inferior results to other fabrication processes. See "Deposition of $Ba_{1-x}Sr_xTiO_3$ and $SrTiO_3$ Via Liquid Source CVD (LSCVD) For ULSI DRAMs", given at the 1992, International Symposium on Integrated Ferroelectrics, Mar. 9–11, 1992.

3. Solution to the Problem

The present invention solves the above problems by providing BST thin films in which the grain size is much smaller than the thickness of the film. The average grain size of the BST grains in the thin films according to the invention is about 40 nm. Typical film thicknesses of the dielectrics in integrated circuit capacitors are 100 nm to 200 nm. Thus the grain size in the BST thin films according to the invention is 2.5 to 5 times smaller than the film thickness. This small grain size results in capacitors with much improved electrical properties.

The process according to the invention preferably includes deposition of a liquid precursor by a spin-on process. Preferably the liquid precursor is an alkoxycarboxylate precursor as described in U.S. patent application Ser. No. 08/132,744 filed Oct. 6, 1993, which is hereby incorporated by reference. The liquid precursor is dried and annealed to form the BST. Preferably the annealing is performed at a temperature between 700° C. and 850° C.

In an exemplary embodiment, capacitors made with a dielectric material comprising BST thin films having the formula $Ba_{1-x}Sr_xTiO_3$, where x is 0.03, were found to have a dielectric constant of nearly 500 and a leakage current of about $10^{-9}$ amps/cm² when made by the process of the invention. The dielectric constant is about twice as large and the leakage current is about ten times as small as the best respective properties reported in the prior art for BST thin films. Numerous other features, objects and advantages of the invention will become apparent from the following description when read in conjunction with the accompanying drawings.

DESCRIPTION OF THE PREFERRED EMBODIMENT

1. Overview

Figure 3:
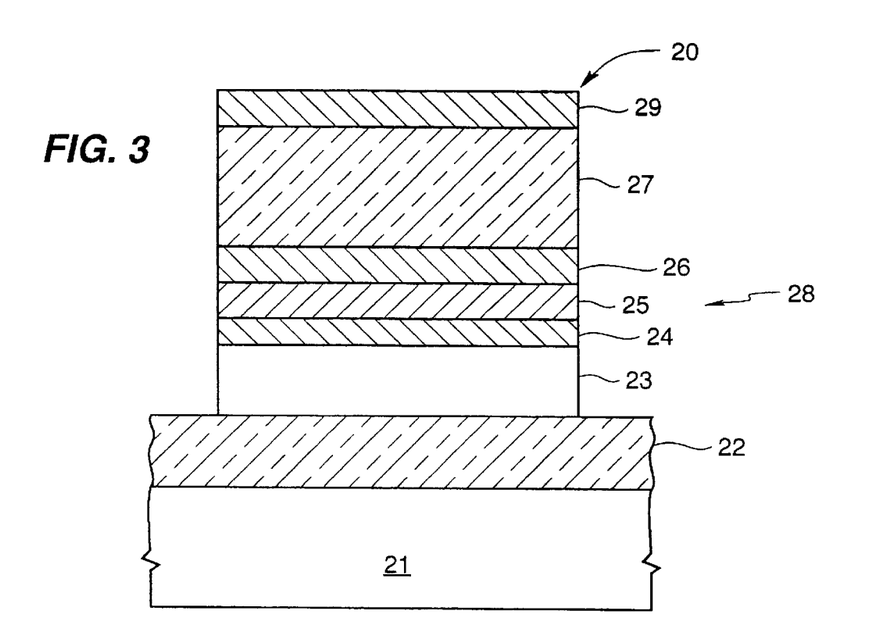
FIG. 3 is a cross-sectional view of an integrated circuit capacitor according to the invention.
Figure 4:
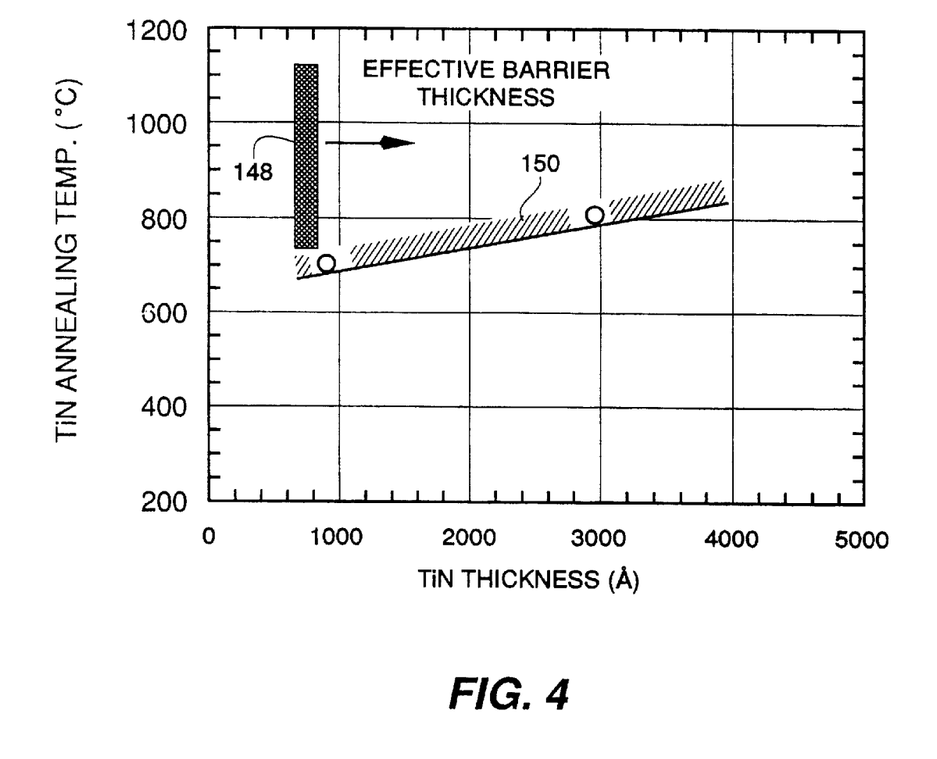
FIG. 4 is a graph of TiN thickness versus TiN annealing temperature illustrating how the effective barrier thickness varies with anneal temperature.
Figure 5:
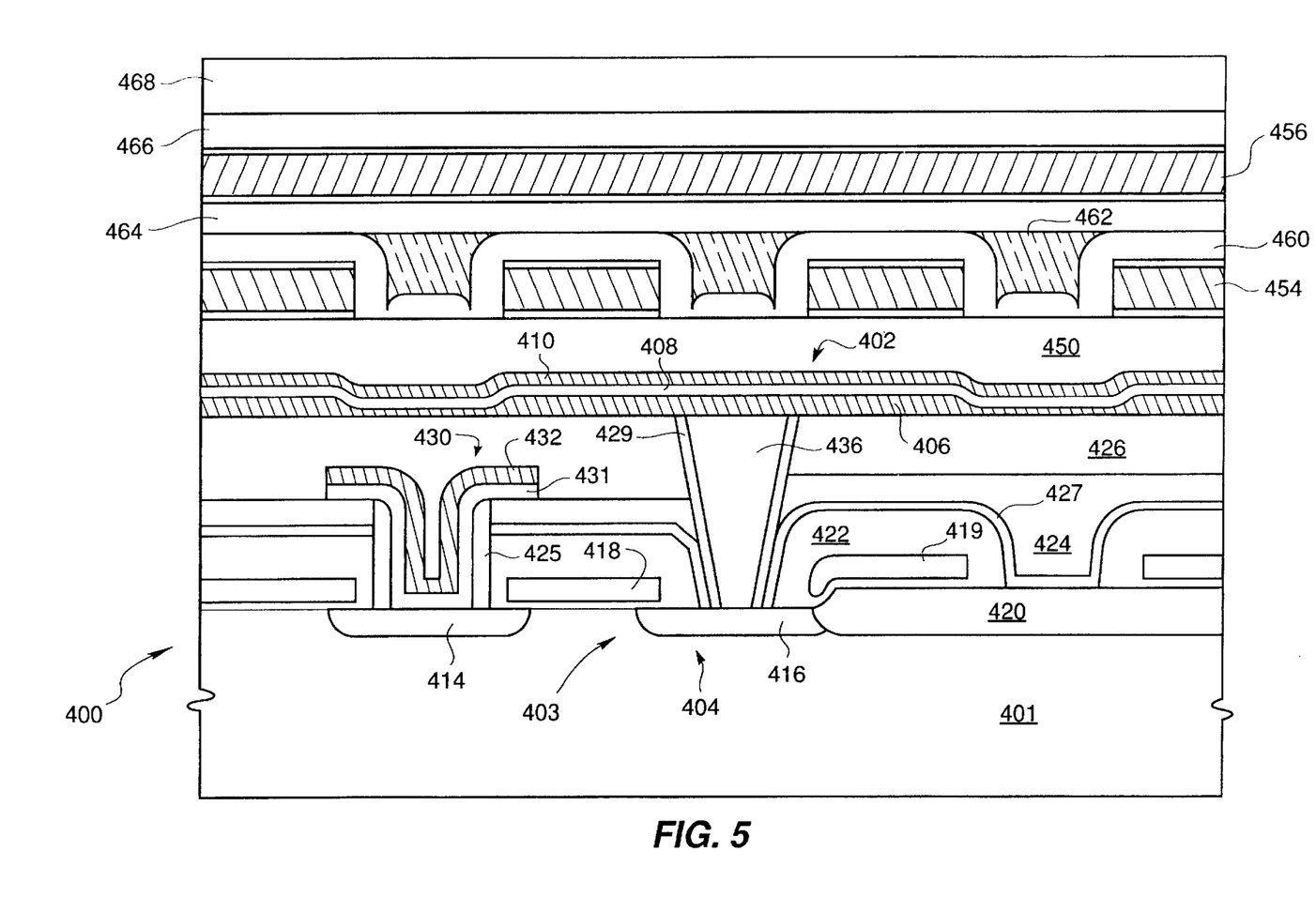
FIG. 5 is a cross-sectional view of an integrated circuit memory cell utilizing the invention and showing advantages of the invention.

FIG. 3 shows a cross-sectional view of an integrated circuit capacitor 20 according to the invention. Capacitor 20 is formed on a substrate 28 comprising a silicon base substrate 21, a silicon dioxide layer 22, a doped polysilicon layer 23, a titanium layer 24, and a titanium nitride layer 25. In this disclosure the term "substrate" is used both in a general sense in which it means any underlying layer or layers and a particular sense in which it means the base wafer, such as 21 in FIG. 3, on which the integrated circuit is made. In the general sense, any layer or group of layers in FIGS. 3–5, except the top most layer, forms a substrate for the subsequent layer or layers. Capacitor 20 comprises a platinum first electrode 26, sometimes referred to as the "bottom electrode 26", a layer 27 of dielectric material, and a second electrode 29, sometimes referred to as the "top electrode". FIG. 5 shows a cross-sectional view of a portion of an integrated circuit DRAM memory 400. Memory 400 includes a capacitor 402 and a transistor 404. Capacitor 402 comprises a first electrode 406, a dielectric layer 408 and a top electrode 410. Transistor 404 comprises source/drain 414, gate 418, and source/drain 416. It should be understood that the FIG. 3 depicting a capacitor and FIG. 5 depicting an integrated circuit device are not meant to be actual plan or cross-sectional views of any particular portion of an actual capacitor or integrated circuit device, but are merely idealized representations which are employed to more clearly and fully depict the structure and process of the invention than would otherwise be possible.

Figure 1:
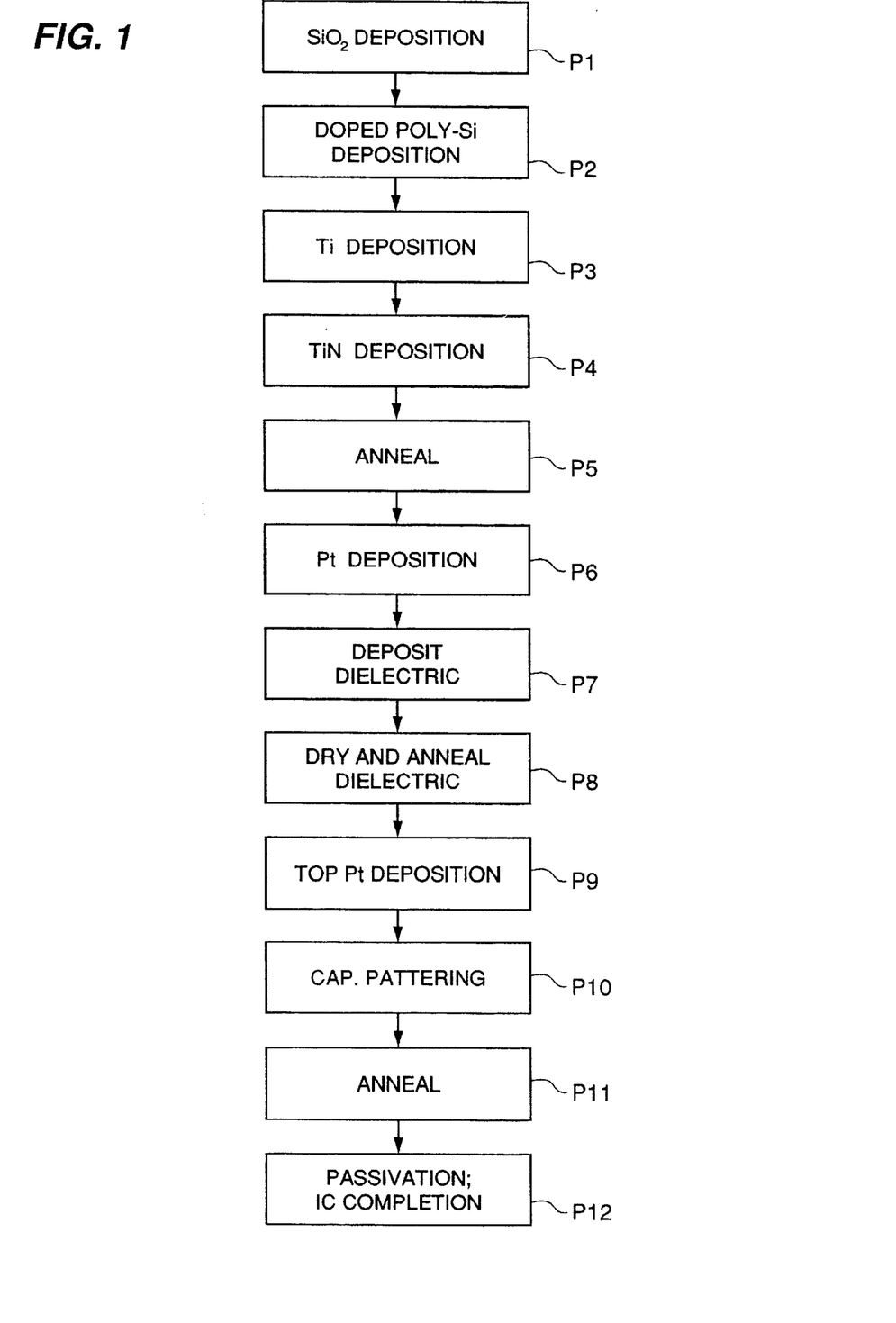
FIG. 1 is a flow chart of a process according to the invention for making a capacitor utilizing BST as the dielectric material.
Figure 2:
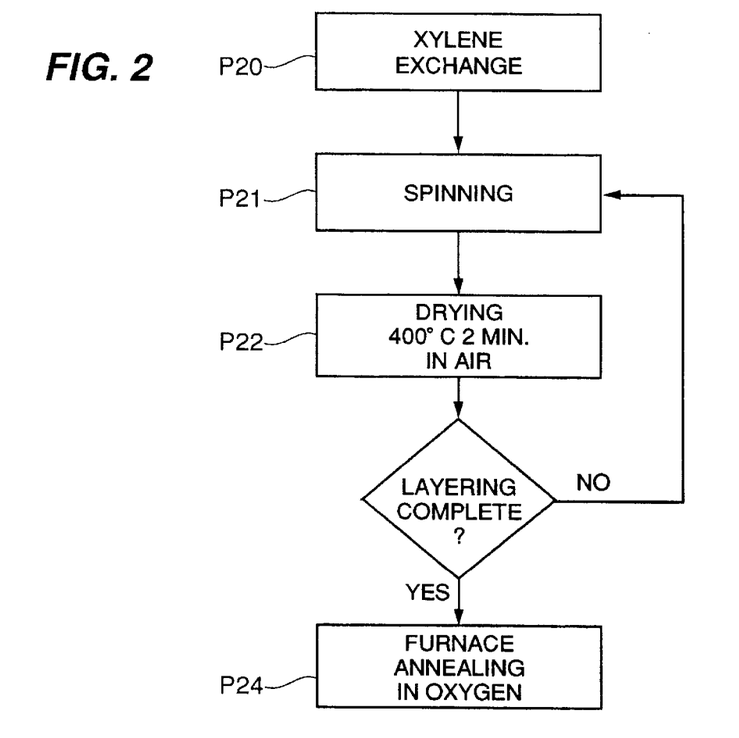
FIG. 2 is a flow chart showing the preferred BST formation process.
Figure 6:
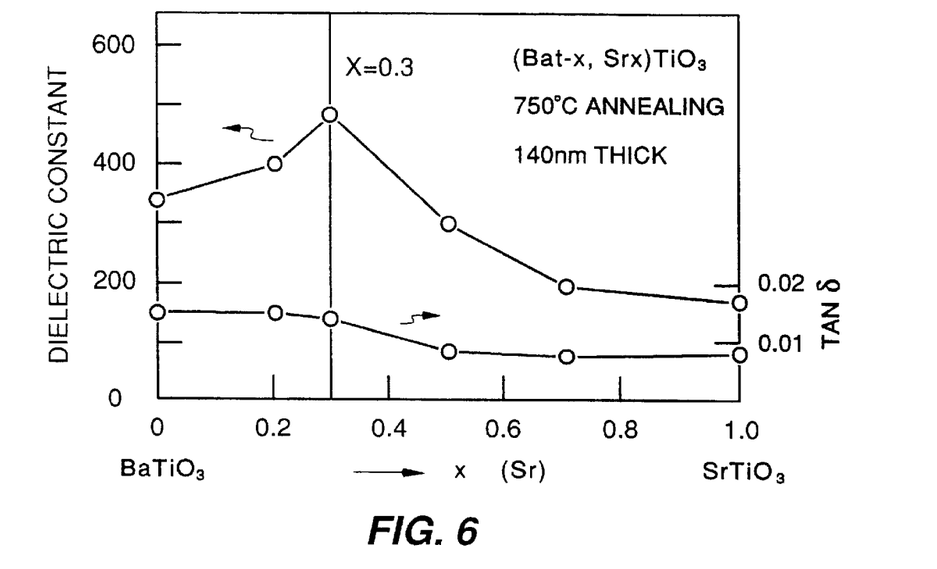
FIG. 6 is a graph showing the real part of the dielectric constant (upper curve) and the imaginary part of the dielectric constant (lower curve) as a function of x for capacitors as shown in FIG. 3 with $Ba_{1-x}Sr_xTiO_3$ as the dielectric material.
Figure 8:
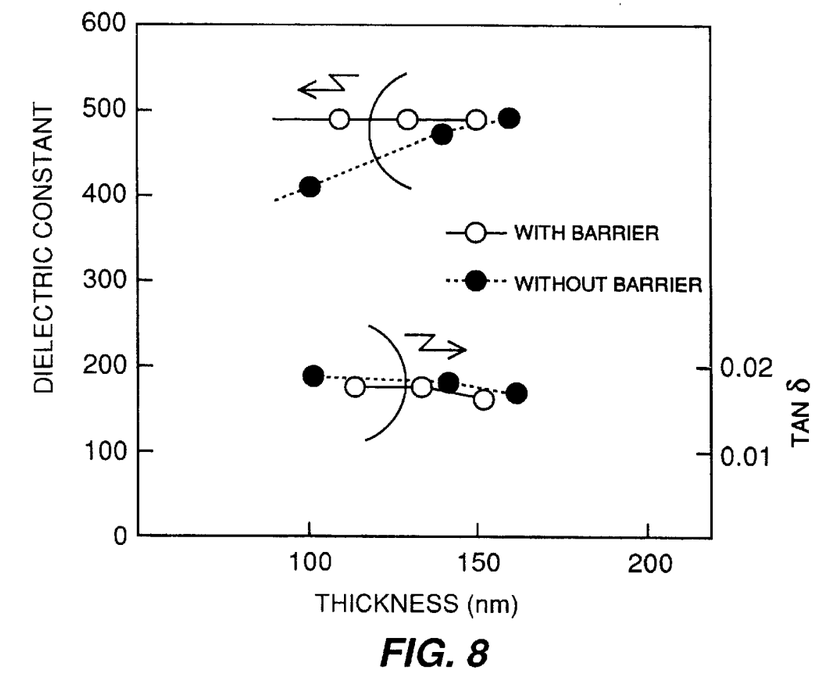
FIG. 8 is a graph showing the real and imaginary parts of the dielectric constant as a function of dielectric thickness for BST capacitors made with and without a TiN barrier layer made by the process of the invention.
Figure 9:
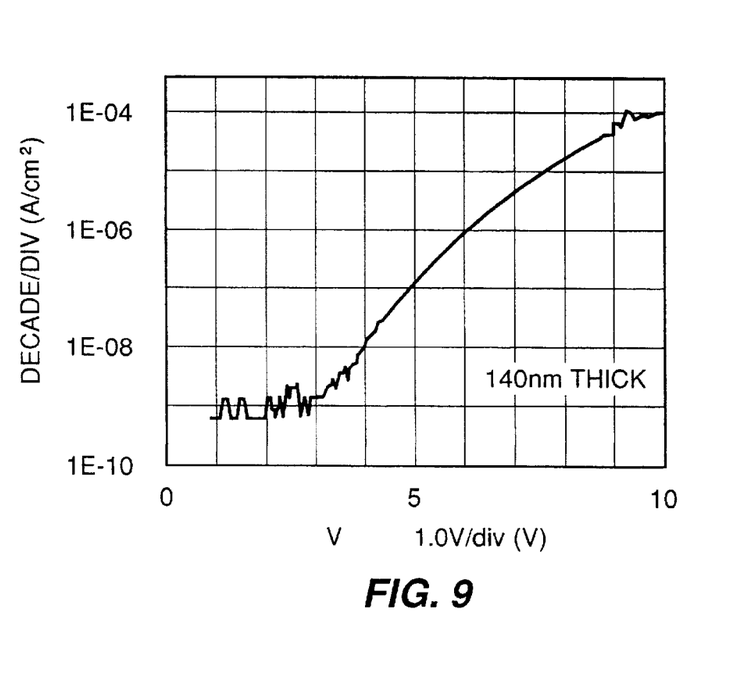
FIG. 9 is a graph showing the leakage current as a function of voltage for a BST capacitor according to the invention.

Dielectric layers 27 and 408 are preferably made of barium strontium titanate, commonly called BST, by the process of the invention, a flow chart of which is shown in FIGS. 1 and 2. FIGS. 6, 8, and 9 show properties of BST capacitors according to the invention. FIGS. 6 and 8 indicate that the dielectric constant can be nearly 500, while FIG. 9 shows the leakage current is as low as 10$^{-9}$ A/cm$^2$ (amps per centimeter squared). Other properties will be discussed below. As a result of the excellent properties of the capacitors 20 according to the invention, simple planar capacitors, such as capacitor 402, may be utilized in ULSI circuits, such as memory 400. This greatly simplifies the fabrication process, increases yields, and decreases costs.

2. Detailed Description of the Exemplary Embodiments

Turning now to a more detailed description of the invention, the capacitors 20 (FIG. 3) and 402 (FIG. 5), according to the invention are formed on a base substrates 21 and 401, respectively, which base substrates are preferably made of silicon, although other base substrates, such as gallium arsenide, indium antimonide, magnesium oxide, strontium titanate, sapphire, quartz and combinations of the forgoing as well as other materials may be used. In each case insulating layers 22, 420, 427 etc. and/or conducting layers, such as layers 23 and 436 are formed between the base substrates 21, 401 and the capacitors 20, 402. The insulating layers 22, 420 and 422 etc. are preferably made of silicon dioxide, while the layer 427 is preferably made of silicon nitrate, though combinations of these materials and other insulating materials may also be used. The conductive layers 23 and 436 are preferably made of polysilicon, but may also be made of metal silicide, combinations of the foregoing, and other conductors. There usually will be an adhesion or contact layer, such as 24, between the conducting layer, such as 23, and the capacitor, such as 20. This adhesion or contact layer is preferably titanium, but may also be tantalum, titanium, tantalum silicide, combinations of the forgoing, and other conductors. Often there will also be a barrier layer, such as 25, which prevents migration of materials between the underlying layers, such as 21, 22, and 23, and the capacitor, such as 20. The barrier material is preferably titanium nitride (TiN), but may also be tantalum nitride combinations of the foregoing, and other materials. The capacitor electrodes, 26, 29, etc. are preferably formed of platinum, although palladium, nickel, combinations of the foregoing, and other conductors may be used. The dielectric material 27, 408 is preferably BST, but may also be a metal oxide of the form ABO$_3$, AA'BB'O$_3$, AA'BB'O$_3$, AABO$_3$, etc., a layered superlattice material, combinations of the foregoing, and other dielectrics.

A flow chart of the process for fabricating the integrated circuit capacitor 20 of FIG. 3 is shown in FIG. 1. In step P1 a silicon dioxide layer 22 is formed on silicon wafer 21, preferably by thermal oxidation in an oxygen furnace. Silicon dioxide layer 22 is preferably between about 500 Å to 8,000 Å thick. Then, preferably, in step P2 a layer of doped polysilicon about 5000 Å thick is deposited. In the examples discussed below the doping was P-type. This layer 23 was skipped in some examples discussed below. Then follows step P3 in which a layer 24 of titanium (Ti) of about 500 Å to 600 Å thick is deposited, preferably by sputtering. In this and the other sputtering steps below, an ANELVA ILC-1015 DC magnetron 6" system was used. The sputtering power for the Ti deposition step P3 is about 1 kilowatt Then, in step P4 a layer 25 of titanium nitride (TiN) is deposited, preferably at about 5 kilowatts of power. The thickness of this layer in various samples varied from about 900 Å to about 3000Å. In step P5 the layers deposited up to this point are annealed, preferably in a nitrogen atmosphere at a temperature from 650° C. to 850° C. for about 30 minutes. To distinguish from other anneal steps, we shall refer to this anneal step as the "first anneal" or "barrier anneal". This step will be discussed in more detail in connection with the examples below. Preferably a temperature of 800° C. is used. Then in step P6 a layer 26 of platinum is deposited to form the first electrode 26. In the preferred embodiment, this layer 26 is between about 1800 Å and 2200 Å thick and is formed by DC magnetron sputtering. Then, in step P7, the dielectric 27 is deposited. Preferably the dielectric is BST and the deposition is by spinning an alkoxycarboxylate precursor. However, other materials, such a layered superlattice ferroelctrics, may also be used. Preferably the spinning is at between about 1500 RPM and 2000 RPM for between about 30 and 40 seconds, though this can vary depending on the viscosity of the precursor and the desired thickness of the film 27. In step P8 the dielectric is dried and annealed. This anneal shall be referred to herein as the "second anneal" or the "dielectric anneal". In the case of BST, the drying is done at about 400° C. for from 2–5 minutes. In the case of a ferroelectric, such as strontium bismuth tantalate, the drying is in two steps, one at about 150° C. for about 2 minutes and a second at about 270° C. for about 4 minutes. The drying is done in air or in nitrogen, preferably at low humidity, of about 40% or less. The annealing is preferably in oxygen at from about 700° C. to about 850° C. for from 1 hour to 2 hours. For BST, the annealing is preferably at 750° C. to 800° C. for 80 minutes, while for strontium bismuth tantalate, the annealing is preferably at about 800° C. for about 70 minutes. In some cases an RTP anneal may proceed the furnace anneal. For example, in the case of the strontium bismuth tantalate sample discussed below, an RTP anneal at 100° C./sec ramp rate and a maximum temperature of 725° C. for 30 seconds was performed after the two drying steps. The RTP is preferably performed in oxygen.

A more detailed example of the preferred process for making a BST layer 27, 408 is shown in FIG. 2. In the preferred embodiment, an xylene exchange step P20 is performed just prior to spinning. That is, the original precursor solution prepared and stored is a methoxyethanol-based solution. Just prior to use, the methoxyethanol of the original precursor solution is exchanged for xylene by adding xylene and heating to evaporate out the methoxy-ethanol which has a lower boiling temperature than the xylene. The xylene solution is spun on the substrate 28 in step P21 at between about 1500 RPM and 2000 RPM for between about 30 and 40 seconds, then the precursor is dried in air at between 375° C. and 425° C., preferably at about 400° C., for about 2 minutes. The drying temperature is significantly higher than in the prior art. The drying may also be done in nitrogen. The spinning step P21 is repeated. Preferably it is repeated once for a total of 2 layers, though more layers could be used. After the layering is complete, the multiple layers of dried precursor on the substrate 28 are annealed in step P24 to form the BST dielectric layer 27, 408.

Turning back to FIG. 1, then follows the second electrode 29 deposition, again preferably platinum with a thickness in the range of about 1800 Å to 2200 Å, preferably about 1800 Å thick, and preferably by sputtering. Then the capacitor is patterned in step P10, preferably by ion milling or RIE (reactive ion etching), is annealed again in step P11, preferably at 750° C. to 800° C. for about 30 minutes in oxygen. We shall refer to this anneal as the "third anneal" or "capacitor anneal". In step P2 a passivation layer may be deposited and the integrated circuit completed. The passivation is preferably either NSG or PSG silicon glass deposited with an APCVD or LPCVD process. The passivation and other layers used are not shown in FIG. 3 as these steps were not completed in most examples to facilitate testing of the capacitors. However these layers are shown in FIG. 5.

Before proceeding with detailed examples of the of the process and integrated circuit structure of the invention, an example of the formulation of a precursor solution will be given. A precursor for barium strontium titanate (BST) having the formula $Ba_{0.7}Sr_{0.3}TiO_3$ was formulated as follows. The compounds shown in Table I were measured.

TABLE 1

| Compound | FW | g | mmole | Equiv. |
|---|---|---|---|---|
| Barium | 137.327 | 9.4255 | 68.635 | 0.69986 |
| 2-ethylhexanoic acid | 144.21 | 19.831 | 137.51 | 1.4022 |
| Strontium | 87.62 | 2.5790 | 29.434 | 0.30014 |
| 2-ethylhexanoic acid | 1.44.21 | 8.5005 | 88.945 | 0.6010 |
| Titanium Isopropoxide | 284.26 | 27.878 | 98.072 | 1.0000 |

In the above table, "FW" indicates formula weight, "g" indicates grams, "mmoles" indicates millimoles, and "Equiv." indicates the equivalent number of moles in solution. The barium was placed in 100 ml (milliliters) of 2-methoxyethanol, the 2-ethylhexanoic acid was added and the mixture allowed to react while stirring. The step may also be preformed by placing the barium in the 2-methoxyethanol, allowing it to react, adding the 2-ethyihexanoic acid, and stirring while y reacts. The reaction of the barium heated the solution. While the solution was still hot, the strontium was added and allowed to react. When the strontium was all reacted, then the second measure of 2-ethylhexanoic acid was added and, while stirring, the solution was heated to a maximum temperature of 115° C. This ensures that all water is distilled out. It is noted that this precursor and others discussed below were made at atmospheric pressure at Colorado Springs, CO. The mixture was then allowed to cool, and the titanium isopropoxide was added followed by the addition of enough 2-methoxyethanol to make 220 ml total solution. The solution was then heated and stirred with a maximum temperature of 116° C. The solution was then diluted to 200 ml total solution with additional 2-methoxyethanol. The result was a final BST precursor of 0.490 Moles concentration with the ratio of barium to strontium equal to 0.69986:0.30014.

BST precursor solutions made as described above, except with varying ratios of the barium and strontium, were utilized to fabricate a series of capacitors as shown in FIG. 3, except that the TiN layer 25 was not used. Ratios of barium and strontium were selected such that in the formula $Ba_{1-x}Sr_xTiO_3$, x had the values 0.0, 0.2, 0.3, 0.5, 0.7, and 1.0. The capacitors were fabricated as described above with reference to FIGS. 1 and 2, with the temperature of the anneals in steps P5, P8 and P11 being 750° C. and the layer 27 of BST formed in the deposition step P7 being about 140 nm (nanometers) thick. The dielectric constant of the various samples was measured and the results graphed as a function of x are shown in FIG. 6. The upper curve is the real part of the dielectric constant, the units and values of which are given at the left side of the graph. The lower curve is the imaginary part of the dielectric constant and the units and values are given on the right side of the graph. It is seen that the real part of the dielectric constant reaches a peak of nearly 500 at a value of x=0.3 as with bulk BST, and that the curve otherwise almost exactly follows the curve for bulk BST. Likewise the lattice constant for the samples was measured and found to change in almost the same manner as for bulk BST. This indicates that the BST thin films formed by the process of the invention are of nearly the same high quality as bulk BST, unlike the prior art BST thin films. The $Ba_{0.7}Sr_{0.3}TiO_3$ sample was examined with a transmission electron microscope (TEM) and it was found that it had a fine grain size of about 40 nm, which was about 3.5 times smaller than the film thickness. As is well-known in the art, grain sizes vary in any material, and thus when we say grain size herein, we mean an average grain size. The excellent quality of the films is believed to be in a large part due to this small grain size.

Figure 7:
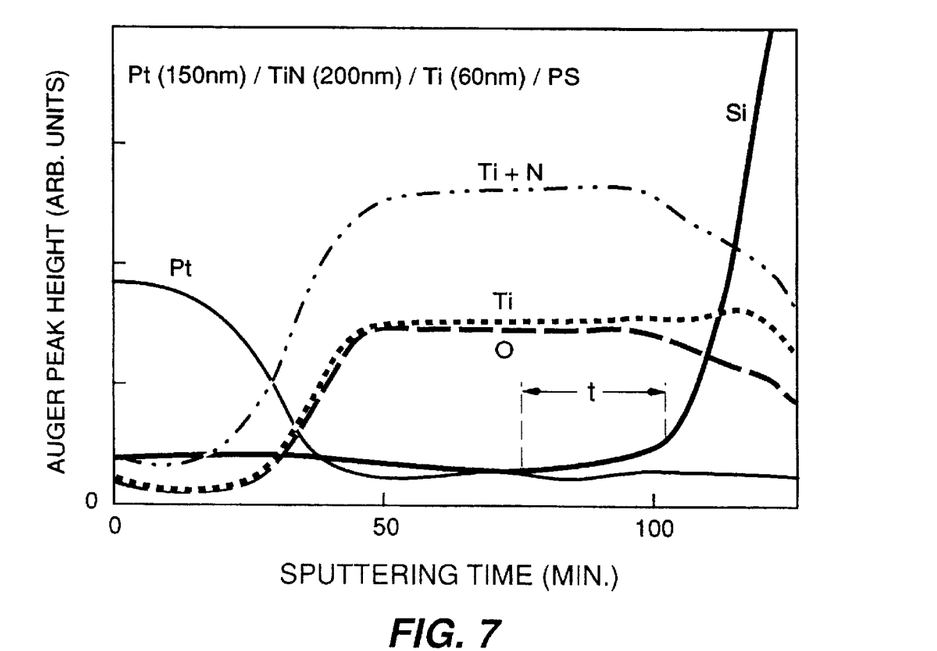
FIG. 7 is a graph showing the AES depth profile of a Pt/TiN/Ti electrode made by the process of the invention.

As indicated above, it is well-known that silicon will diffuse from the silicon layers 21, 22, and 23 into the layers 25, 26, and 27 containing metal. Since the layer 27 is rich in oxygen, the silicon will form silicon dioxide, a low dielectric constant material, which degrades the dielectric constant of the capacitor. It is also well-known that titanium nitride (TiN) is one of the most effective barriers to silicon diffusion. Thus a substrate 28 (FIG. 3) including a 600 Å layer 24 of Ti, a 2000 Å layer 25 of TiN, and a 1500 Å layer 26 of platinum was made as described in reference to FIG. 1, except that the anneal in step P5 was made at a temperature of 750° C. in an oxygen atmosphere instead of nitrogen. The depth profile of the resulting substrate 28 was made by Auger Electron Spectroscopy (AES) and the result is shown in FIG. 7. The results show that the TiN layer 25 effectively works as a barrier layer to silicon diffusion. From the figure, an effective barrier thickness, t, can bee seen to be between about 800 Å and 1000 Å. A similar curve for a substrate 28 without a TiN layer 25 showed that silicon diffused to the surface of the platinum layer 26. Capacitors as shown in FIG. 3 with and without the TiN layer 25 were made with a $Ba_{0.7}Sr_{0.3}TiO_3$ dielectric layer 27 of varying thickness, with the anneals in steps P5, P8, and P11 being at 750° C. The effective dielectric constants of the dielectrics of the two capacitors were measured, and the results are shown in FIG. 8 as a function of BST film thickness. The real part of the dielectric constant of the capacitors with the TiN barrier 25 remains stable down to 110 nm, while the real part of the dielectric constant of the capacitors without the TiN barrier 25 degrade below 150 nm.

The above experiments indicate that a practical DRAM memory with a simple, flat capacitor structure may be made. A cross-sectional view of such a memory 400 that has been designed and fabricated is shown in FIG. 5. Memory 400 is formed on a silicon wafer 401 and includes a transistor 404 and a flat, planar capacitor 402 which together form the a memory cell 403. Doped areas 414 and 416 form the source/drains of transistor 404, while the gate 418 of the transistor 404 and other word line portions, such as 419, are formed of polysilicon. Field oxide regions 420 and gate oxide regions 422 insulate the gate/word line polysilicon 418. A polycide bit line 430 comprising a polysilicon layer 431 and a metal silicide layer 432 connects the source/drain 414 to external circuits. A polysilicon plug 436 connects the source/drain 416 to the first electrode 406 of capacitor 402. Silicon nitride layers 427 and 429, oxide layers 424 and 425, and BPSG (borophosphosilicate glass) layer 426 further insulate the circuit elements. The capacitor 402 includes the first or bottom electrode 406, the second or top electrode 410, and dielectric 408. The details of the capacitor structure are not shown in FIG. 5 because of the scale of the figure. However, the bottom electrode 406 is preferably a multi-layered structure of Ti/TiN/Pt as shown in FIG. 3, or may be TiSix/TiN/Pt, a four-layered structure such as TiSix/Ti/TiN/Pt, TiSix/Ta/TiN/Pt, or many other structures which include an adhesion layer 24 and barrier layer 25. Dielectric layer 408 is preferably $Ba_{0.7}Sr_{0.3}TiO_3$, but may be other formulations of BST, other high dielectric materials, such as high dielectric constant layered superlattice materials, or ferroelectric layered superlattice materials. Second or top electrode 410 is preferably formed of platinum, but may also be TiN, Ti or may be multilayered, like the bottom electrode 406. BPSG layer 450 separates the capacitor 402 and the metallization layers 454 and 456 above it. First metallization layer 454 and second metallization layer 456 are preferably multilayered, with layer 454 preferably formed, from bottom to top, of Ti/TiN/Al/TiN and layer 456 formed of TiN/Al/TiN. Both layers are shown as sandwiches rather than show the details since they are not directly related to the invention herein. Plasma deposited $SiO_2$ layers 460 and 464, SOG (spin-on glass) layer 462, and PSG (phosphosilicate glass) layer 466 insulate the metallization layers 454 and 456. A passivation layer of plasma deposited silicon nitride ($Si_3N_4$) completes the memory 400.

Figure 10:
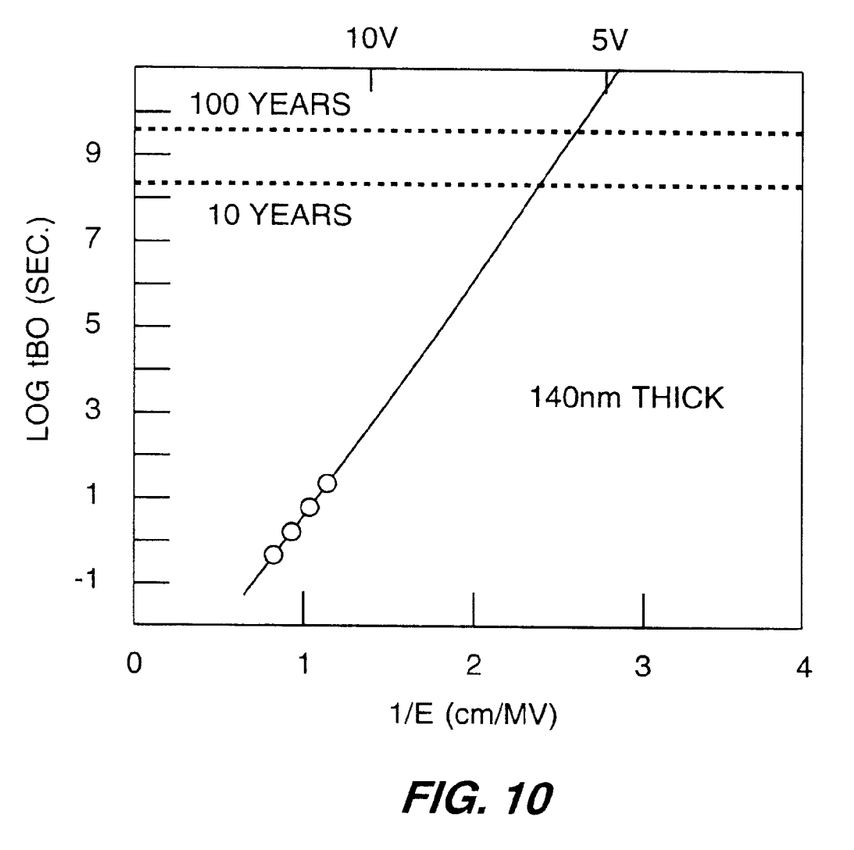
FIG. 10 is a graph showing the TDDB characteristics of a memory cell according to the invention.

A DRAM cell capacitor 402 as shown in FIGS. 3 and 5 was fabricated according to the process of FIGS. 1 and 2 using $Ba_{0.7}Sr_{0.3}TiO_3$ as the dielectric, a platinum first electrode 26, a TiN barrier layer 25 and a Ti adhesion layer 24. The thickness of the BST film 27 was 140 nm. The temperature of the anneal step P5 was 700° C., the temperature of the anneal step P8 was 750° C., and the temperature of the anneal step P11 was 750° C. The leakage current of the capacitor was measured as a function of voltage and the result is shown in FIG. 9. The leakage current is about $2 \times 10^{-9}$ amps/cm$^2$ at a voltage as low as 3 volts, which is the size of the maximum voltages used in state-of-the-art DRAMS. The TDDB characteristics of the fabricated capacitor cell are shown in FIG. 10. The calculations show that the breakdown of the capacitor cell should be over 100 years under a stress voltage of 5 volts. With its dielectric constant of nearly 500, the capacitor according to the invernion has a capacItance of 32 femtofarads/micron$^2$, which is equivalent to a $SiO_2$capacitor 1.3 nm thick. Thus the integrated circuit structure and process of the invention is quite practical for memories.

Figure 11:
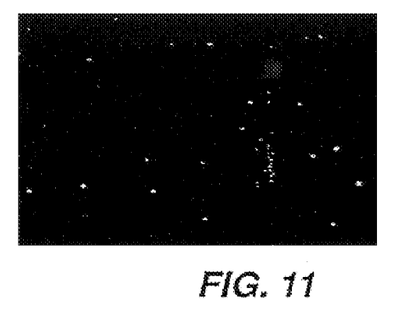
FIG. 11 is a microphotograph of a BST thin film on a Pt/TIN/Ti/D-PS/SiO$_2$/Si substrate in which the wafer was annealed in N$_2$ at 650° C. after deposition of the TiN and was annealed at 800° C. in oxygen after deposition of the BST.
Figure 12:
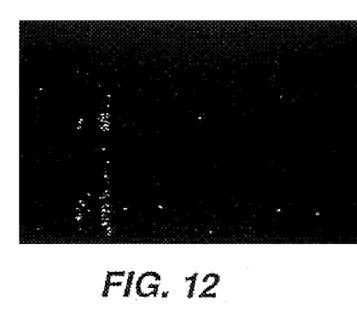
FIG. 12 is a microphotograph of a BST thin film made in the same manner as the thin film of FIG. 10 except that the TiN anneal was at 700° C.
Figure 13:
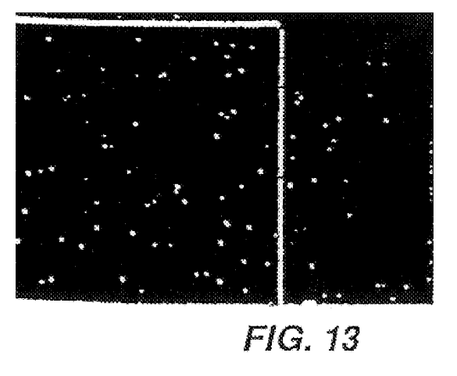
FIG. 13 is a microphotograph of a BST thin film on a Pt/TIN/Ti/D-PS/SiO$_2$/Si substrate in which the wafer was annealed at 750° C. in N$_2$ after deposition of the TiN and was annealed at 750° C. in oxygen after deposition of the BST.
Figure 14:
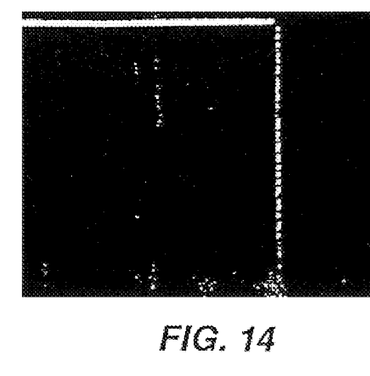
FIG. 14 is a microphotograph of a BST thin film in the same manner as the thin film of FIG. 10 except that the TiN anneal was at 800° C.

Further experiments have been carried out to optimize the process of the invention. Two devices as shown in FIG. 3, but without the second electrode 29, were fabricated using a 1100 Å thin film of $Ba_{0.7}Sr_{0.3}TiO_3$ as the dielectric layer 27, a 1800 Å platinum first electrode 26, a 900 Å layer 25 of TiN, a 500 Å layer 24 of Ti, a 5000 Å layer 23 of doped polysilicon, and a 1000 Å layer 22 of $SiO_2$. The dielectric anneal in step P8 was performed at 800° C. for 60 minutes. For one device the barrier anneal step P5 was performed at a temperature of 650° C. for 30 minutes in $N_2$, while for the second device the temperature was 700° C. Photomicrographs of the BST are shown in FIGS. 11 and 12 respectively. In each case the thickness of the TiN layer 25 was about 900 A. For the device in which the barrier anneal step P5 was performed at 650° C., white dots are visible in the photomicrograph. These are believed to be material, such as silicon, diffusing through the BST. For the device annealed at 700° C., no such diffusion occurs. Thus a barrier anneal temperature of greater than 650° C. is preferable. The same experiment was performed with two devices made in the same way except the doped polysilicon layer 23 was not used. Thus the Ti layer 24 was deposited on $SiO_2$ rather than polysilicon. The results were nearly the same, with the diffusion materials showing up as white dots on the BST film when the barrier anneal P5 temperature was 650° C. and not being present when the barrier anneal temperature was 700° C. In another experiment two devices as shown in FIG. 3, without the second electrode 29 and otherwise as just described above, were fabricated except that the dielectric anneal in step P8 was performed at 750° C. for 80 minutes in oxygen. In the first device the barrier anneal step P5 was performed at 750° C. for 30 minutes in $N_2$, and in the second device the barrier anneal step P5 was performed at 800° C. for 30 minutes in $N_2$. Photomicrographs of the BST surface of the two devices are shown in FIGS. 13 and 14, respectively. In each case the thickness of the TiN layer 25 was about 3000 Å. In the photomicrograph of the device in which the TiN was annealed at 750° C., the white dots are evident. Note that the lines making a 90 degree angle in the figures is the edge of the BST layer 27, the material to the right of the BST being the bottom electrode 26. In the other device annealed at 800° C., no white dots are present. A plot of the TiN annealing temperature versus TiN thickness for the two experiments is shown in FIG. 4. The graph indicates that as the annealing temperature increases the effective barrier thickness, t, increases significantly. The region 148 shown in the graph approximately describes the region along the x-axis in which the TiN thickness is becoming thick enough to be effective. As indicated by the arrow, from this region on, an effective barrier is possible. That is, the barrier thickness is preferably approximately 800 Å or more. Further, for each barrier thickness, there is a range of annealing temperatures, shown by the hatched region 150, in which the best device morphology results. For example, for a barrier thickness of about 1000 Å, a barrier anneal temperature of about 700° C. to about 750° C. is preferred, although up to about 800° C. will produce good results. That is, barrier anneal step P5 is performed at a temperature within a good morphology range of 100° C. above a base barrier anneal temperature that depends on the thickness of the titanium nitride layer. Preferably the base barrier anneal temperature varies from about 700° C. for an effective barrier thickness of about 1000 Å to about 800° C. for an effective barrier thickness of about 3000 Å. That is, the good morphology area extends about 100° C. above a line with a slope of about 500° C. per 1000 Å increase in thickness, with the line passing through the above points, i.e. 700° C. @ 1000 Å and 800° C. @ 3000 Å. For all TiN thicknesses, the good morphology temperature range is relatively small; that is, small differences in the TiN anneal temperature can make significant differences in electrical properties. Preferably, the TiN anneal temperature should be 675° C. or more for any barrier thickness. Preferably the barrier anneal temperature and the dielectric anneal temperature should be within about 150° C. of each other.

There has been described novel thin film BST structures and processes for fabricating integrated circuit capacitors utilizing BST thin films. It should be understood that the particular embodiments shown in the drawings and described within this specification are for purposes of example and should not be construed to limit the invention. Further, it is evident that those skilled in the art may now make numerous uses and modifications of the specific embodiment described, without departing from the inventive concepts. For example, equivalent materials, different material thicknesses, and other methods of depositing the substrate and electrode layers may be used. It is also evident that the process steps recited may in some instances be performed in a different order. Or equivalent structures and processes may be substituted for the various structures and processes described. The structures and processes may be combined with a wide variety of other structures and processes.

We claim:

1. An integrated circuit including a capacitor comprising a pair of electrodes and a layer of barium strontium titanate interposed between said pair of electrodes, said layer of barium strontium titanate having a thickness of less than 1000 nanometers and having an average grain size smaller than 200 nanometers.

2. An integrated circuit as in claim 1 wherein the average grain size of said barium strontium titnate is 40 nanometers or less.

3. An integrated circuit as in claim 2 wherein said barium strontium titanate has the formula $Ba_{0.7}Sr_{0.3}TiO_3$.

4. An integrated circuit as in claim 1 and further including a substrate on which said capacitor is formed, wherein said substrate is made of a material selected from the group consisting of silicon, gallium arsenide, indium antimonide, magnesium oxide, strontium titanate, sapphire and quartz.

5. An integrated circuit as in claim 4 and further including an insulating layer between said substrate and said capacitor.

6. An integrated circuit as in claim 5 wherein said insulating layer comprises a material selected from the group consisting of silicon dioxide, silicon nitrate, and combinations thereof.

7. An integrated circuit as in claim 4 and further including a conducting layer between said substrate and said capacitor.

8. An integrated circuit as in claim 7 wherein said conducting layer comprises a material selected from the group consisting of polysilicon, a metal silicide, and combinations thereof.

9. An integrated circuit as in claim 7 and further including a contact layer between said conducting layer and said capacitor.

10. An integrated circuit as in claim 7 wherein said contact layer comprises a material selected from the group consisting of titanium, tantalum, titanium silicide, tantalum silicide, and combinations thereof.

11. An integrated circuit as in claim 4 and further including a barrier layer between said substrate and said capacitor.

12. An integrated circuit as in claim 11 wherein said barrier layer comprises material selected from the group consisting of TiN, TaN, and combinations thereof.

13. An integrated circuit as in claim 1 wherein said capacitor includes an electrode comprising a material selected from the group consisting of platinum, palladium, nickel, and combinations thereof.

* * * * *